US011293952B2

(12) United States Patent
Mueller et al.

(10) Patent No.: US 11,293,952 B2
(45) Date of Patent: Apr. 5, 2022

(54) PASSIVE CURRENT SENSOR WITH SIMPLIFIED GEOMETRY

(71) Applicant: TE Connectivity Germany GmbH, Bensheim (DE)

(72) Inventors: Christoph Mueller, Colgenstein-Heidesheim (DE); Sven Faas, Karlsruhe (DE); Jens Gruendler, Schutterwald (DE); Walter Weinerth, Mannheim (DE); Thimo Paulus, Mannheim (DE); Claudio Negretti, Waghaeusel (DE); Christoph Kraemer, Mannheim (DE)

(73) Assignee: TE CONNECTIVITY GERMANY GMBH, Bensheim (DE)

( * ) Notice: Subject to any disclaimer, the term of this patent is extended or adjusted under 35 U.S.C. 154(b) by 0 days.

(21) Appl. No.: 16/818,511

(22) Filed: Mar. 13, 2020

(65) Prior Publication Data
US 2020/0292588 A1   Sep. 17, 2020

(30) Foreign Application Priority Data

Mar. 14, 2019 (DE) .................. 10 2019 203 496.9

(51) Int. Cl.
*G01R 19/00* (2006.01)
*G01K 1/14* (2021.01)
*G01R 1/20* (2006.01)

(52) U.S. Cl.
CPC .......... *G01R 19/0092* (2013.01); *G01K 1/14* (2013.01); *G01R 1/203* (2013.01)

(58) Field of Classification Search
CPC .... G01R 19/0092; G01R 19/00; G01R 15/00; G01K 1/14
See application file for complete search history.

(56) References Cited

U.S. PATENT DOCUMENTS

| 5,857,258 | A | * | 1/1999 | Penzes | H01C 10/06 |
| | | | | | 29/846 |
| 6,304,062 | B1 | * | 10/2001 | Batson | G01R 1/203 |
| | | | | | 320/134 |
| 2008/0030208 | A1 | * | 2/2008 | Aratani | G01R 1/203 |
| | | | | | 324/713 |
| 2008/0050985 | A1 | * | 2/2008 | Roset | G01R 31/364 |
| | | | | | 439/754 |
| 2011/0089931 | A1 | * | 4/2011 | Podlisk | G01R 1/203 |
| | | | | | 324/126 |
| 2014/0210479 | A1 | * | 7/2014 | Rink | G01R 1/203 |
| | | | | | 324/426 |
| 2018/0156844 | A1 | * | 6/2018 | Kameko | G01R 15/146 |
| 2019/0170791 | A1 | * | 6/2019 | Hetzler | G01R 1/203 |
| 2019/0244971 | A1 | * | 8/2019 | Harari | H01L 27/11573 |

OTHER PUBLICATIONS

German Office Action, dated Apr. 17, 2019, 2 pages.

* cited by examiner

*Primary Examiner* — Dominic E Hawkins

(57) ABSTRACT

A passive current sensor includes a pair of electrically conductive busbars, a shunt resistor electrically connecting the busbars, and a support having a first pair of voltage drop measuring contacts. At least one of the voltage drop measuring contacts is attached to each of the busbars and forms a direct electrical contact between the at least one voltage drop measuring contact and the busbar.

14 Claims, 10 Drawing Sheets

PASSIVE CURRENT SENSOR WITH SIMPLIFIED GEOMETRY

CROSS-REFERENCE TO RELATED APPLICATION

This application claims the benefit of the filing date under 35 U.S.C. § 119(a)-(d) of German Patent Application No. 102019203496.9, filed on Mar. 14, 2019.

FIELD OF THE INVENTION

The present invention relates to a current sensor and, more particularly, to a passive current sensor.

BACKGROUND

Passive current sensors are used to measure a voltage drop at a shunt resistor. These current sensors are used, for example, in automotive engineering in the area of electrically powered vehicles. In these vehicles, such a passive current sensor is used to measure the flowing current, i.e. a current intensity. The shunt resistor is inserted between two electrically conductive busbars. The shunt resistor has a very low resistance value, which is, however, sufficiently high to be able to measure a voltage drop on both sides of the shunt resistor. Usually the resistance value of a shunt resistor is in the range of a few tens of microohms.

The busbars interconnected by the shunt resistor are contacted by contacts of a printed circuit board (PCB) soldered to the busbars. On such a PCB there are corresponding conductor tracks and connections to which plug-in contacts can be soldered for tapping the measured voltage signals (the voltage drop at the shunt resistor). The electrical plug contacts are connected indirectly via the PCB by soldering to the busbar or busbars. Such a soldered connection is not high-strength and has little resistance to aging and, furthermore, due to the PCB, a quality of the soldered connection cannot be easily tested.

SUMMARY

A passive current sensor includes a pair of electrically conductive busbars, a shunt resistor electrically connecting the busbars, and a support having a first pair of voltage drop measuring contacts. At least one of the voltage drop measuring contacts is attached to each of the busbars and forms a direct electrical contact between the at least one voltage drop measuring contact and the busbar.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
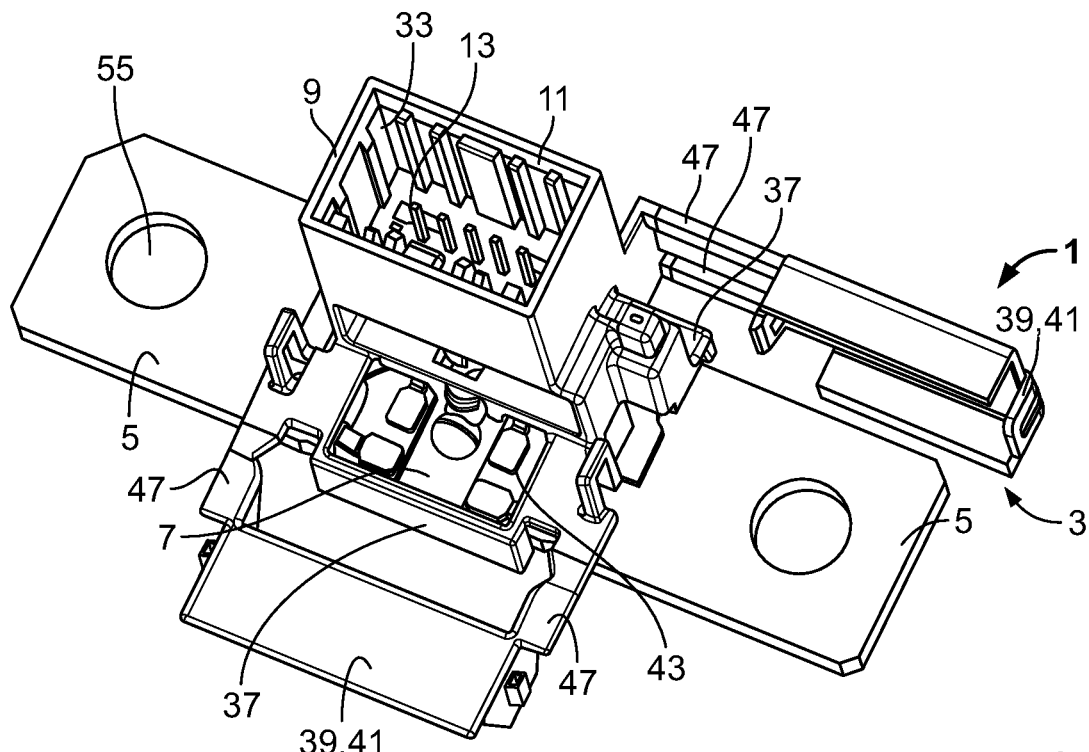
FIG. 1 is a perspective view of a passive current sensor according to an embodiment.

In the following, the invention is explained in more detail with reference to the embodiments shown in the drawings. Identical technical features and technical features with the same function are given the same reference signs. Repeated descriptions are avoided as far as possible and differences are especially emphasized. The embodiments shown in the figures are purely exemplary and are not intended to restrict the present invention to the embodiments shown. The technical features of individual embodiments can be combined with each other in any combination and can also be omitted in special embodiments, provided that the technical effect achieved with the omitted technical feature is not important in a particular embodiment.

Figure 2:
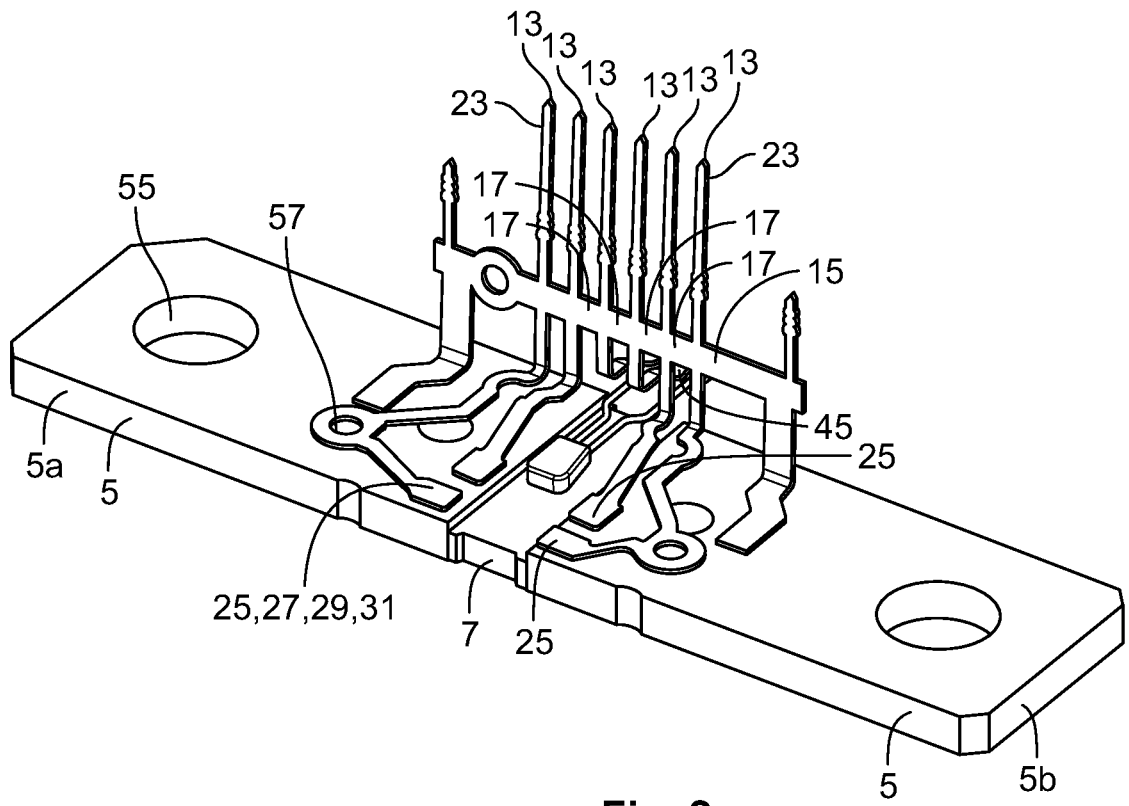
FIG. 2 is a perspective view of the current sensor without a housing.
Figure 3:
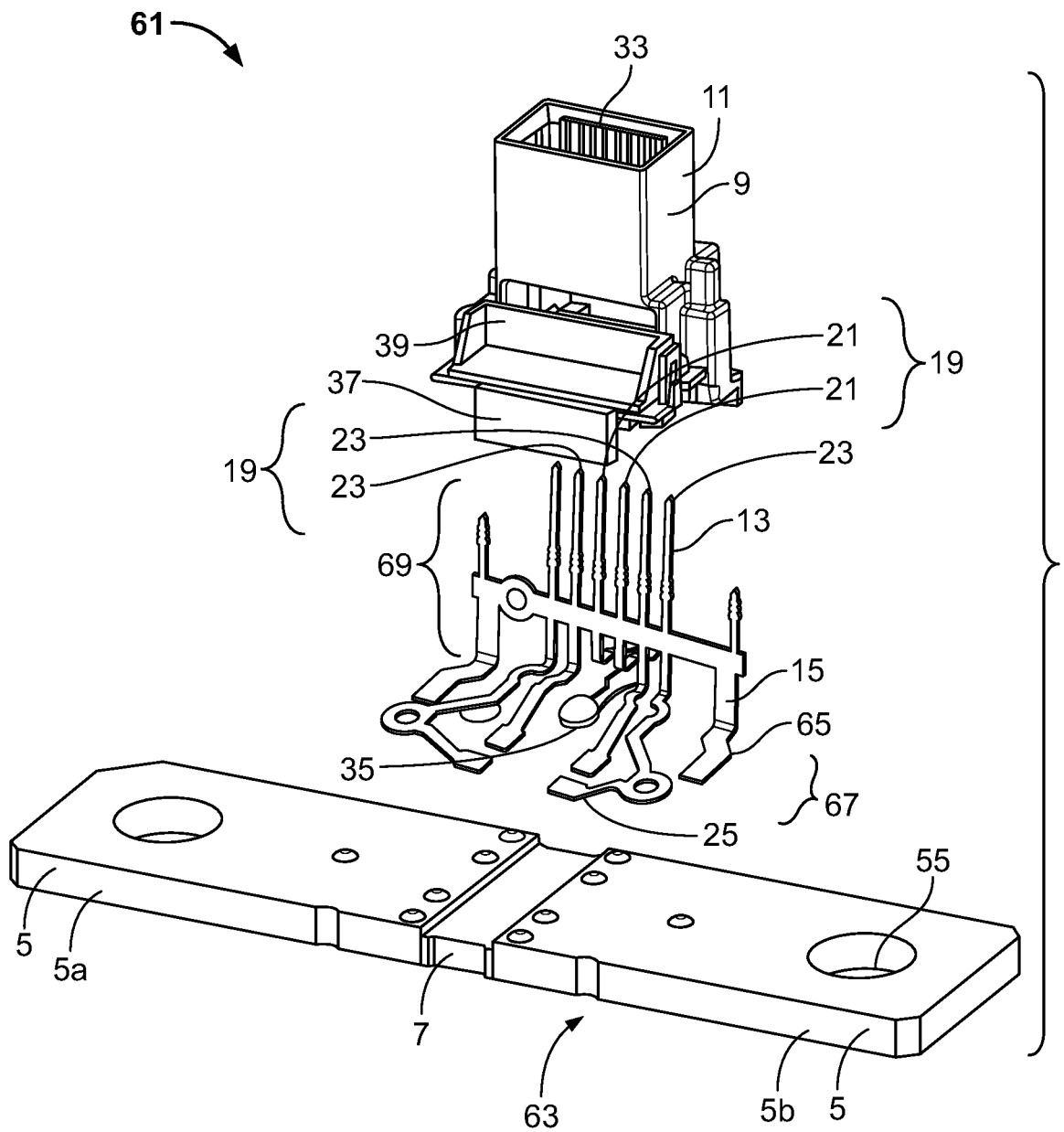
FIG. 3 is an exploded perspective view of an assembly for assembling the passive current sensor.

A passive current sensor 1 according to an embodiment is shown in a pre-assembly position 3 in FIG. 1. The passive current sensor 1 includes a pair of electrically conductive busbars 5, which are electrically and mechanically connected to each other by a shunt resistor 7, as shown in FIGS. 1-3. The passive current sensor 1 has a support 9, which is designed as a housing 11 in the embodiment shown in FIG. 1.

The support 9 or the housing 11 is not shown in FIG. 2 for the sake of clarity. A multitude of contact pins 13 can be seen, which are arranged in a stamping grid 15 and are spaced and oriented to each other. The stamping grid 15 has connecting webs 17, whereby for the sake of clarity only four are provided with a reference sign.

In the embodiment shown in FIGS. 2 and 3, the contact pins 13 are provided in pairs, with one pair 19 of temperature measuring contacts 21 and two pairs 19 of voltage drop measuring contacts 23. The voltage drop measuring contacts 23 may also be referred to as Kelvin contacts. Each temperature measuring contact 21 is electrically isolated from each of the busbars 5 and the shunt resistor 7. The temperature measuring contacts 21 can be assigned to the shunt resistor 7 and can be positioned closer to the shunt resistor 7 than to the busbars 5. Between the shunt resistor 7 and the temperature measuring contact 21, an insulating material bridge can be provided, which may include air, for example.

Each of the voltage drop measuring contacts 23 is connected to the busbar 5 at at least one connection section 25 of the corresponding voltage drop measuring contact 23. The connection 27 at the connection section 25 is a direct electrical and mechanical connection 29, i.e. the voltage drop measuring contacts 23 are directly and immediately attached to the corresponding busbar 5 without an intermediate member. This is done, for example, by a soldered or welded joint 31. The connection 29 can be material-locking, frictional, electrical or mechanical, or any combination thereof. In an embodiment, only faulty wetting, a so-called "cold solder joint", may be used here.

If the voltage drop measuring contact 23 is a stamping part, such a connection section 25 can be created by bending a section of the voltage drop measuring contact 23. The connecting section 25 can be located at a free end of the voltage drop measuring contact 23 or in a central area. In the latter case, the voltage drop measuring contact 23 thus has a convex bulge in the direction of the busbar 5.

The voltage drop measuring contacts 23 are to be understood as electrical contact members, from which the voltage potential applied at these points can be tapped on both sides of the shunt resistor 7 and via which a voltage difference between the voltage drop measuring contacts 23 can be determined. In particular, the voltage tapped on both sides of the shunt resistor 7 is substantially present at every point of the relevant busbar 5. A voltage dropping at a resistor (the shunt resistor 7) operated in series is tapped by the voltage drop measuring contacts 23 parallel to this resistor 7 and made available for further processing via the ohmic law to determine the current flowing through the resistor 7. The voltage is provided via the contact pins 13, which are accommodated in the housing 11. The housing 11, in an embodiment, is a plug socket, whereby the voltage drop can be read out via contact pins 13 projecting into the plug socket or which can be tapped via the plug socket and passed on for further processing.

The two pairs 19 of voltage drop measuring contacts 23 shown in FIGS. 2 and 3 may be provided for redundancy. Pairs 19 may be distinguishable or indistinguishable. Furthermore, one or more connecting webs 17 located between the voltage drop measuring contacts 23 of one of the busbars 5 can be retained. Connecting webs 17, which connect voltage drop measuring contacts 23 attached to different busbars 5, must be cut off before using the passive current sensor 1. The same applies to connecting webs 17, which are present between the temperature measuring contacts 21 or between a temperature measuring contact 21 and a voltage drop measuring contact 23.

Portions of the voltage drop measuring contacts 23, apart from the connection sections 25, can be arranged in a plane that is parallel to the busbar 5. This distance can be ensured by the support 9 or, in a further embodiment, by a housing 11 which keeps the received voltage drop measuring contacts 23 at precisely this distance from the busbars 5. Only the connection sections 25 can extend in the direction of the busbar 5 by precisely this distance and touch it mechanically. The connecting sections 25 can therefore already touch the busbars 5 before the connecting sections 25 are directly attached electrically and mechanically to the busbars 5. The connecting section 25 can be easily created by bending or stamping during the stamping process to create the stamping grid 15.

The support 9 can be connected to at least one fastener from the list of fasteners comprising: at least two clamping sections; at least one undercut member; and at least one latching member connected to at least one bus bar 5, as described in detail below. By fixing the support 9 to at least one busbar 5, correct positioning of the voltage drop measuring contacts 23 and/or temperature measuring contacts 21 with respect to the busbar 5 or busbars 5 can be ensured. In particular, the fixing can be free of play, i.e. without play. This is particularly important for use in automotive engineering, as strong vibrations could occur here and play between the support 9 and the busbar 5 could inevitably lead to weakening or even destruction of the electrical and mechanical connection 29 of the voltage drop measuring contacts 23 and/or temperature measuring contacts 21 with a shunt resistor 7.

The busbars 5 can be designated as the first busbar 5a and as the second busbar 5b, as shown in FIGS. 2 and 3, whereby the order of this designation is arbitrary. The busbars 5 used in the passive current sensor 1 are, in an embodiment, flat, elongated cuboids with a thickness less than their width and also a width less than their length. In cross-section, the busbars 5 are rectangular. For a low-loss current conduction, the busbars 5 are made of a material with high electrical conductivity such as metal. For example, the busbar 5 can be made of copper. If the busbar 5 is made of metal, then this also has a high thermal conductivity (heat conductivity) with a high electrical conductivity (as a function of the temperature). This relationship is generally observed for materials whose electrical conductivity and thermal conductivity are based on the same principle (in the case of metals, the movement of weakly bound electrons).

The housing 11 of the passive current sensor 1 shown in FIG. 1 has a connector face 33, in which the contact pins 13 are accommodated and/or fixed. A voltage drop occurring at the shunt resistor 7 as well as a resistance value of a temperature sensor 35 can thus be easily tapped via the connector face 33.

The housing 11 has receiving walls 37; the busbars 5 are aligned with the housing 11 via the receiving walls 37. The housing 11 further has a pair of access protections 39, which are designed as cover elements 41 in the embodiment shown. With the access protections 39, it is possible to cover access recesses 43 at least in sections and to prevent access to elements accessible through these access recesses 43, such as the connection sections 25, the direct electrical and mechanical connections 29, and the temperature sensor 35.

Likewise, connection 27 of the temperature sensor 35 with temperature contact sections 45 is covered by the access protection 39. The temperature contact sections 45 are different from the connection sections 25 of the voltage drop measuring contacts 23 in that they are electrically insulated from the busbars 5 and the shunt resistor 7. This is shown symbolically in FIG. 9. A direct electrical and mechanical connection 29 can also be provided at the temperature contact sections 45, but between the temperature sensor 35 and the corresponding temperature contact section 45 of the corresponding temperature measuring contact 21.

The cover elements 41 of the embodiment shown are each connected to the remaining part of the housing 11 by a pair of connecting sections 47, as shown in FIG. 1, which must be cut through. It is necessary to separate the connecting sections 47 before closing the access recesses 43 with the cover elements 41. In another embodiment, it is possible to provide film hinges.

For fixing the busbars 5, a plurality of mounting holes 55 shown in FIGS. 1-3 can be provided. Possibilities for fixing busbars 5 are known from the prior art and will not be discussed further here.

Stamping grid 15 in FIG. 2 further shows fixing eyes 57, of which only some are marked with a reference sign for the sake of clarity. These fixing eyes 57 serve to fix and/or position the stamping grid 15 in the housing 11 by fixing pins protruding through the fixing eyes 57.

An assembly 61 for assembling a passive current sensor 1 according to an embodiment is shown in FIG. 3. The assembly 61 comprises the housing 11, the stamping grid 15 comprising four voltage drop measuring contacts 23 and two temperature measuring contacts 21, the temperature sensor 35, and a shunt element 63 shown in the embodiment. The shunt element 63 is to be understood as a one-piece element comprising the two busbars 5 and the shunt resistor 7. Such a shunt element 63 may not be present in other embodiments of the assembly 61 according to the invention.

The stamping grid 15 has a bending area 65, as shown in FIG. 3, which connects a busbar contacting area 67 with a plug connecting area 69. Both areas 67, 69 are in the shown embodiment arranged at an angle of 90° to each other, but can be aligned at any angle.

Figure 4:
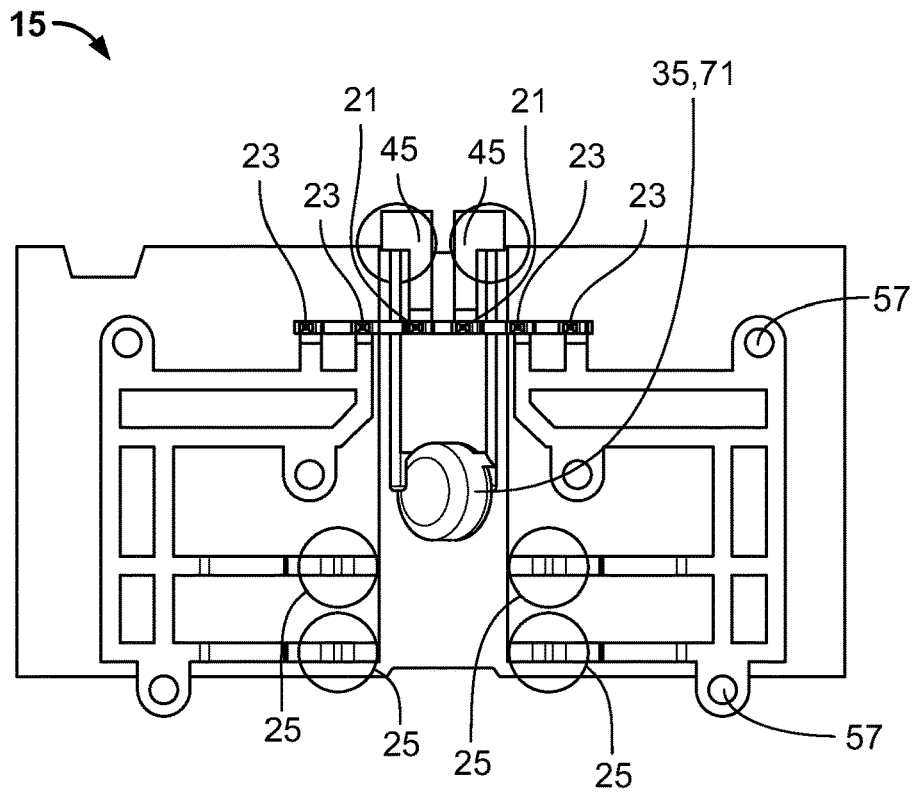
FIG. 4 is a plan view of a stamping grid according to an embodiment.
Figure 5:
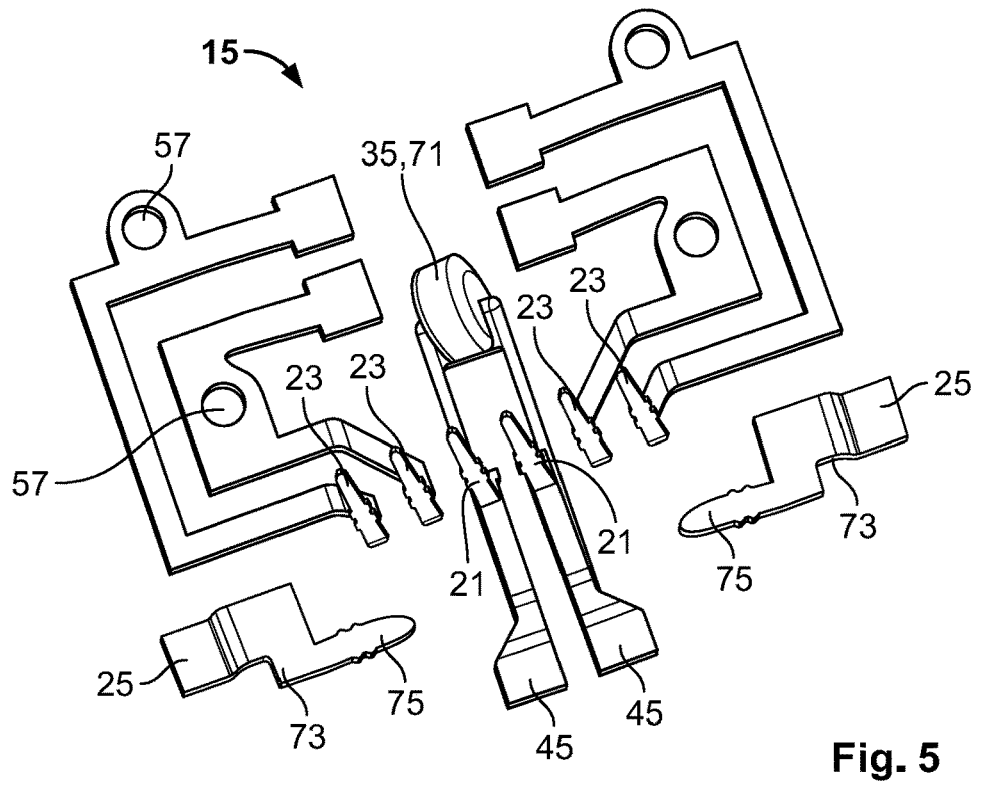
FIG. 5 is a perspective view of a stamping grid according to another embodiment.
Figure 6:
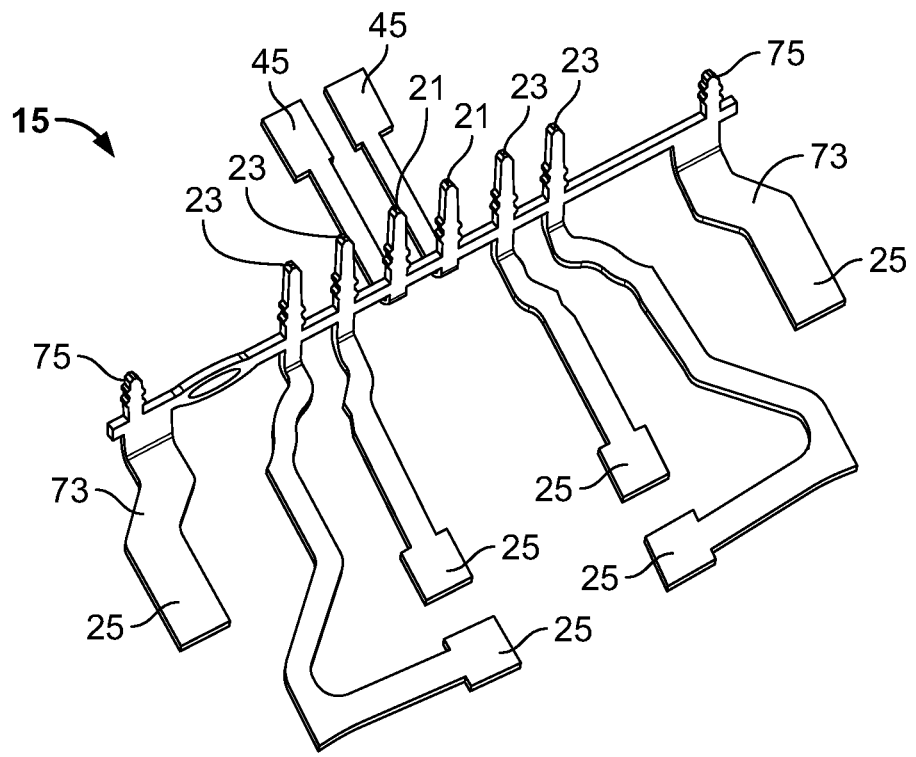
FIG. 6 is a perspective view of a stamping grid according to another embodiment.

The passive current sensor 1 can have differently designed stamping grids 15; three further possible embodiments are shown in FIGS. 4-6. Each of these each have four voltage drop measuring contacts 23, two temperature measuring contacts 21 as well as the corresponding connection sections 25 and temperature contacting sections 45.

In the embodiments of the stamping grid 15 of FIGS. 4 and 5, one temperature sensor 35 is connected to each of the temperature contact sections 45 of the corresponding temperature measuring contacts 21. The temperature sensor 35, in an embodiment, is an NTC temperature sensor 71, but can be any known temperature sensor. Furthermore, the embodiments of the stamping grid 15 shown in FIGS. 4 and 5 have fixing eyes 57. The geometry, position and number of fixing eyes 57 can be selected as required.

Neither the temperature measuring contacts 21 nor the temperature sensor 35 itself may be in electrical contact with the busbars 5 or the shunt resistor 7. This is made possible by an appropriate arrangement of the temperature measuring contacts 21. These are spaced from the busbars 5 and the shunt resistor 7 or are provided with an electrical insulator. Because the voltage drop at the shunt resistor 7 is not only dependent on the current flowing through it, but also shows a dependence on the temperature of the shunt resistor 7 (thermistor/PTC thermistor), the temperature of the shunt resistor 7 is determined in order to correctly determine the flowing current.

The temperature sensor 35 is located at a distance from the busbars 5, which are at a certain voltage level, which prevents electrical crosstalk. In particular, the distance is greater than the creepage distance. Furthermore, an electrically insulating material, for example in the form of an air gap, foil or liquid, may be provided between the busbars 5 and the temperature sensor 35 and the temperature measuring contacts 21. An insulating material, which has a higher thermal conductivity than air, is used in an embodiment. This ensures that the temperature is effectively transferred from the shunt resistor 7 to the temperature sensor 35, while still providing sufficient insulation and thus protection against electrical crosstalk and/or falsified measurement.

In FIGS. 5 and 6, the stamping grid 15 also has a pair of dummy pins 73. These also have connecting sections 25, but do not end in a contact pin 13, but in a fixing pin 75, which is not intended for electrical contact, but only ensures mechanical stabilization of the housing 11 with respect to the shunt element 63.

Figure 7:
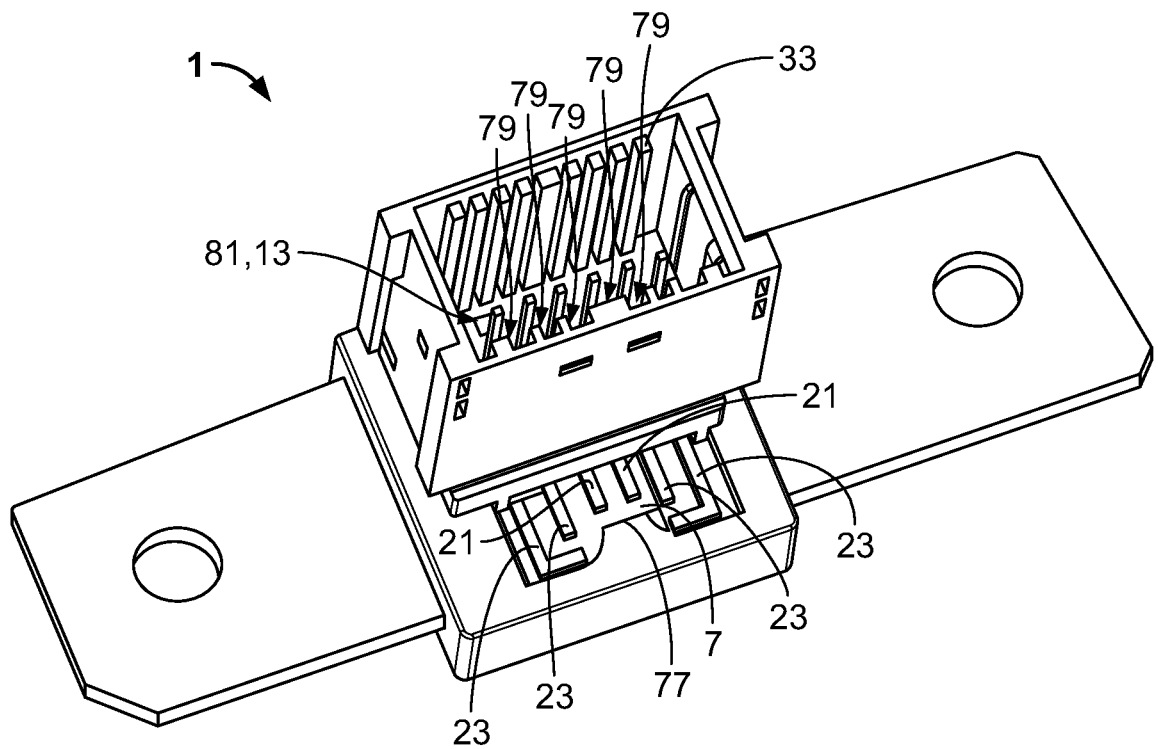
FIG. 7 is a perspective view of a passive current sensor according to another embodiment.

A passive current sensor 1 according to another embodiment is shown in FIG. 7. In addition to the four voltage drop measuring contacts 23, the passive current sensor 1 of FIG. 7 includes an SMD temperature sensor 77, which is attached to the temperature measuring contacts 21, but at the same time is positioned electrically insulated from the shunt resistor 7. In the simplest case, this is ensured by keeping the SMD temperature sensor 77 at a distance from the shunt resistor 7. Also shown in FIG. 7 is the connector face 33, in which the contact pins 13 are accommodated in pin-receiving openings 79 in the housing 11. In an embodiment, the contact pins 13 are designed as plug contacts 81. This has the advantage that the contact pins 13 can be accommodated in the housing 11 with a guide and can also be fixed in their position by them.

Figure 8:
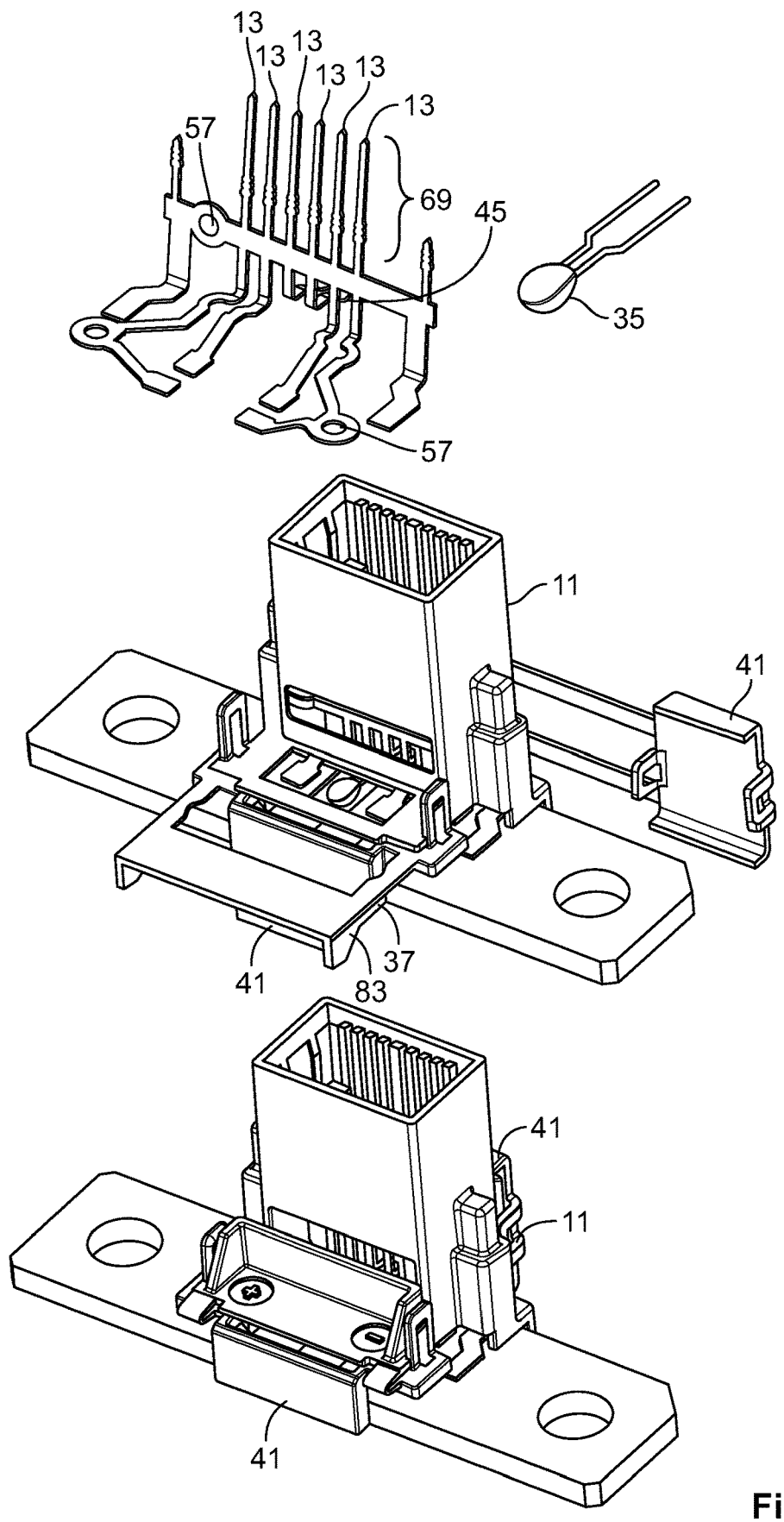
FIG. 8 is a perspective view of a method of assembling a passive current sensor according to an embodiment.

An assembly of the passive current sensor 1 is shown in FIG. 8.

First, the lead frame with the contact pins 13 is produced. Then the lead frame, more precisely the plug connecting area 69 of the contact pins 13, including at least two voltage drop measuring contacts 23, is accommodated in the housing 11. Here, the contact pins 13 can be firmly plugged into the housing 11 and can also be attached to the housing 11 by fixing eyes 57.

The temperature sensor 35 is then attached to the temperature contact section 45 via the access recess with the temperature measurement contacts 21.

The shunt element 63 is then inserted between the receiving walls 37 of the housing 11 until the temperature sensor 35 is located above the shunt resistor 7. Once this is the case, the four voltage drop measuring contacts 23 in the embodiment shown are directly electrically and mechanically connected to the two busbars 5 via their connecting sections 25. Subsequently, a heat conducting material 83, shown in FIG. 8, can also be attached between the temperature sensor 35 and the shunt resistor 7. Such a heat conducting material 83 has a high thermal conductivity and an electrically insulating effect.

The cover elements 41 are then separated from the housing 11 and closed, as shown in FIG. 8.

Figure 9:
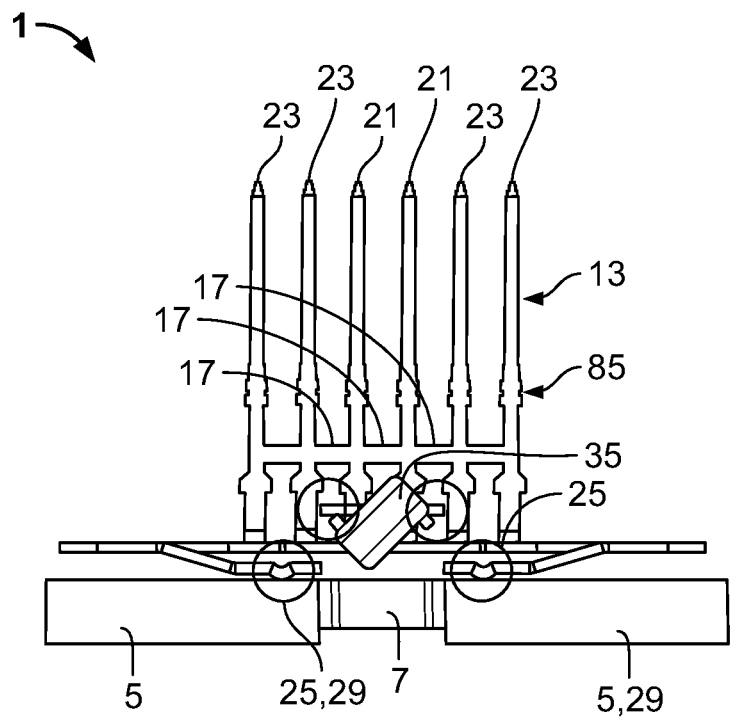
FIG. 9 is a side view of the stamping grid on a busbar.

The passive current sensor 1 is shown without the housing 11 in FIG. 9. As shown in FIG. 9, the voltage drop measuring contacts 23 are in contact with the busbars 5 by their connecting sections 25. Here, a direct electrical and mechanical connection 29 has already been made. The temperature measuring contacts 21, on the other hand, do not touch the busbars 5, nor the shunt resistor 7. The temperature sensor 35 connected to the temperature measuring contacts 21 is at a distance from the shunt resistor 7.

FIG. 9 further shows the connecting webs 17. The connecting webs 17 must be cut before putting the passive current sensor 1 into operation, as otherwise no temperature determination is possible. The contact pins 13 in FIG. 9 have a latching geometry 85, by which they can be fixed in the housing 11 and secured against unintentional removal.

Figure 10:
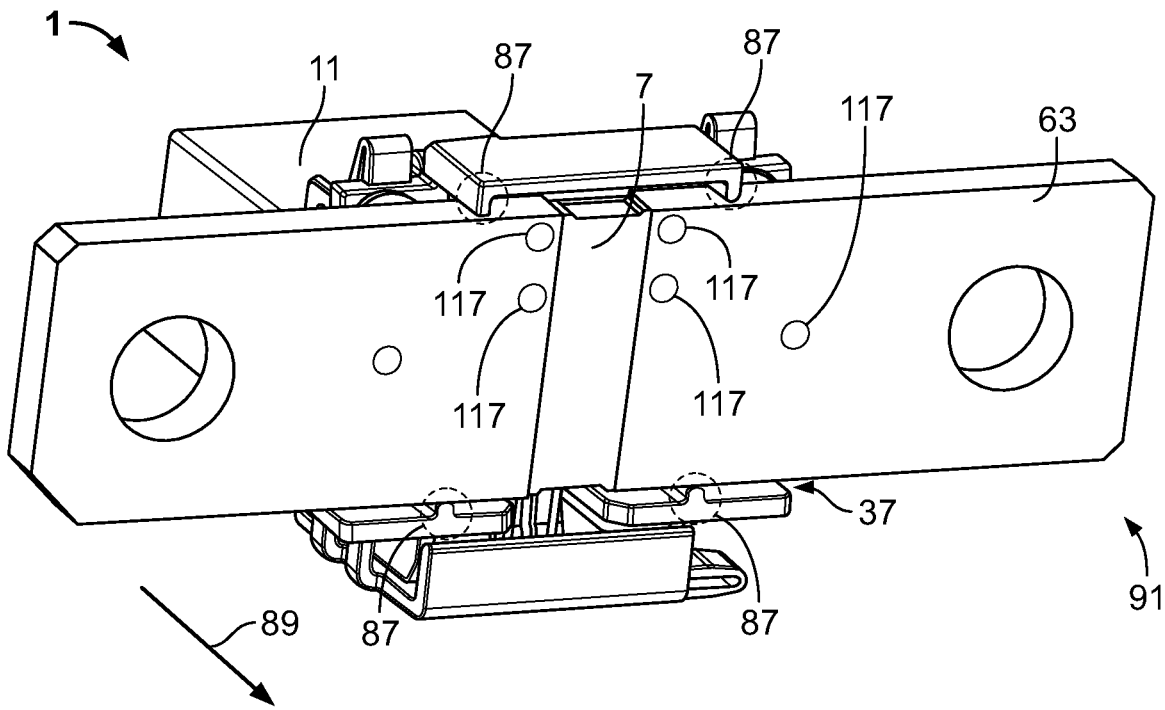
FIG. 10 is a bottom perspective view of a passive current sensor according to another embodiment.

A passive current sensor 1 according to another embodiment is shown in FIG. 10. The embodiment shown in FIG. 10 does not have an undercut element 85 as shown in FIG. 8, but has four clamping sections 87. With the clamping sections 87, the shunt element 63 is accommodated and fixed in the receiving wall 37 of the housing 11. In the embodiment shown, no element of the housing 11 thus protrudes beyond the shunt element 63 in an installation direction 89. A flat underside 91 of the passive current sensor 1 is thus flat and can be flush with the housing 11. Thus, no part of the housing 11 protrudes beyond the underside 91. FIG. 10 further shows recesses 117, which are described in more detail in FIGS. 15-17.

Figure 11:
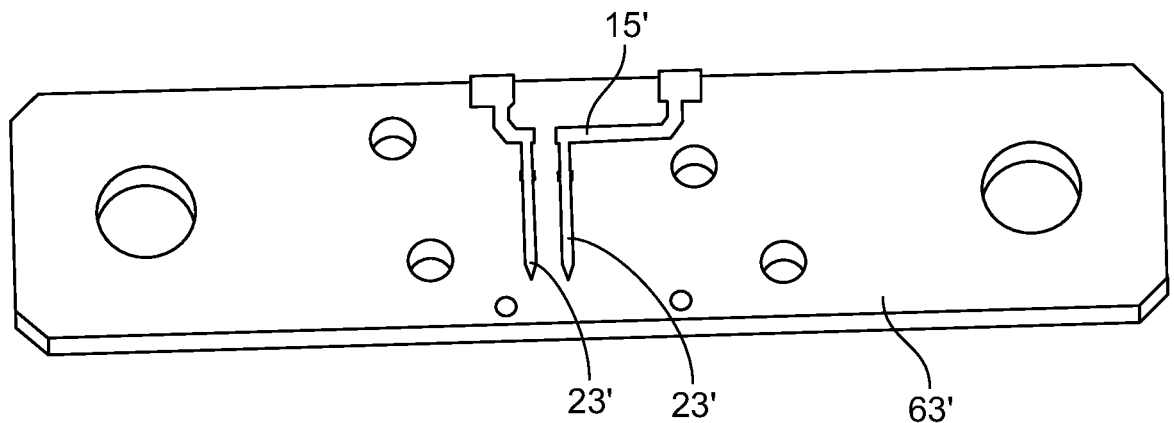
FIG. 11 is a bottom perspective view of a first step of assembling a passive current sensor according to an embodiment.

In FIG. 11-14 a further passive current sensor 1' is shown in different process steps. FIG. 11 shows the stamping grid 15' on the shunt element 63', the stamping grid 15' has only two voltage drop measuring contacts 23'. A housing 11' is provided to accommodate the voltage drop measuring contacts 23' in the corresponding pin-receiving openings of the housing 11'. The housing 11' shown has latching elements 85, which snap into place on the busbar 5.

Figure 12:
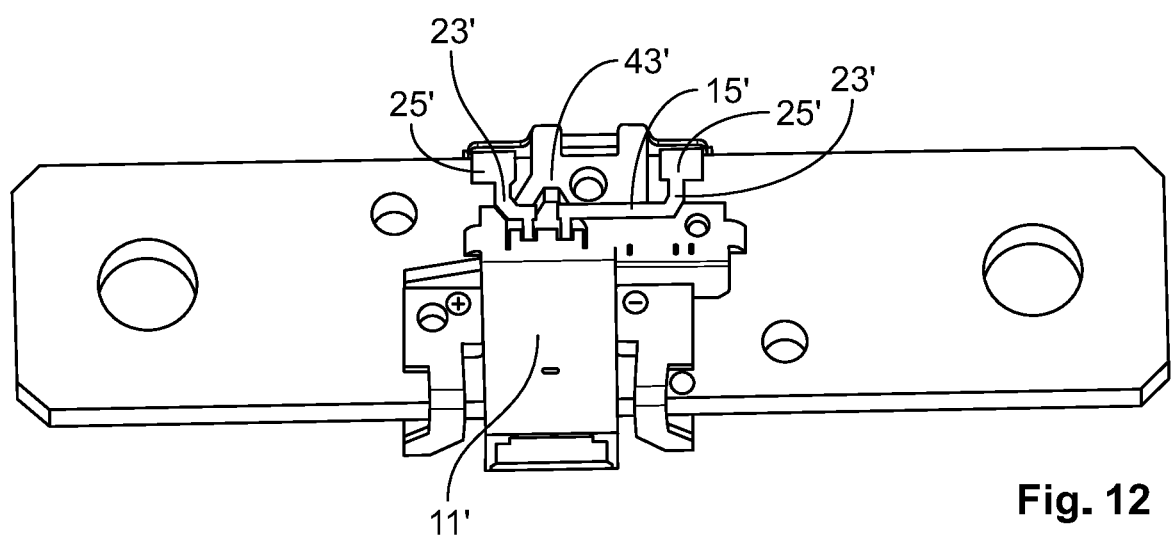
FIG. 12 is a bottom perspective view of a second step of assembling the passive current sensor of FIG. 11.
Figure 13:
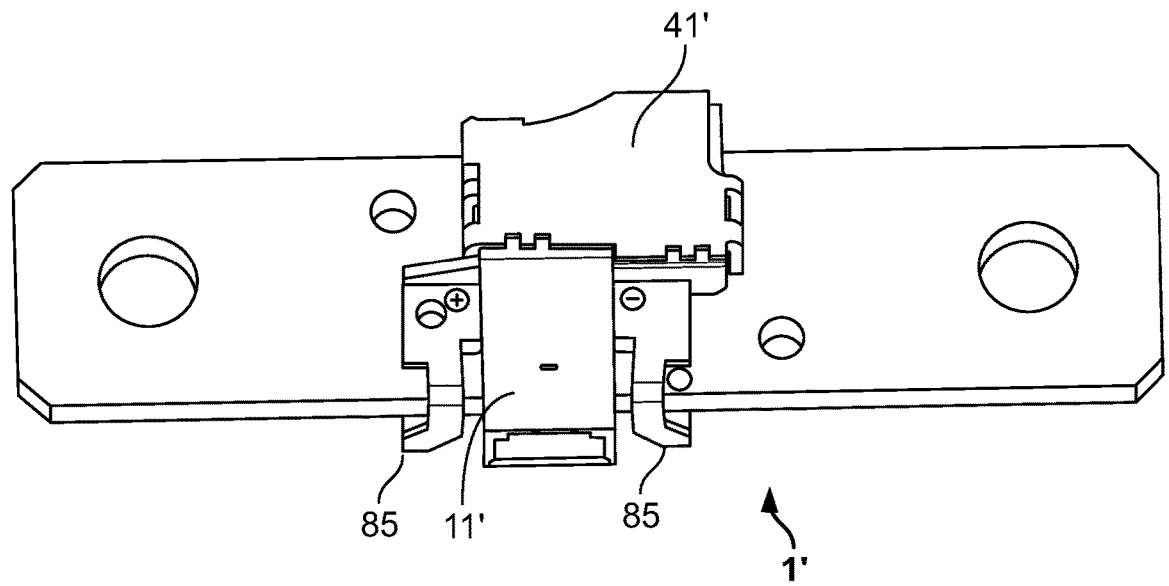
FIG. 13 is a bottom perspective view of a third step of assembling the passive current sensor of FIG. 11.
Figure 14:
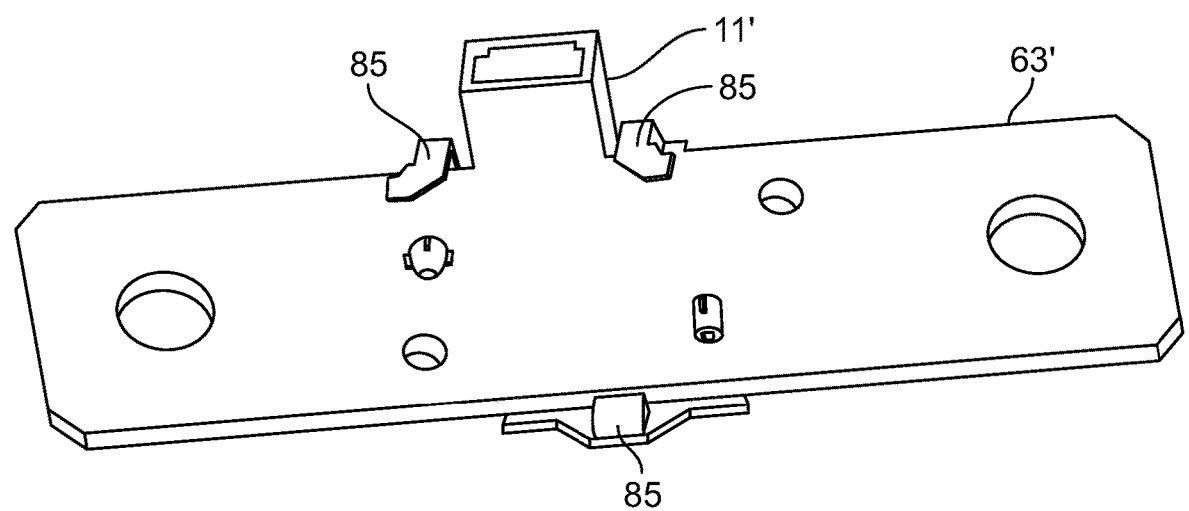
FIG. 14 is a bottom perspective view of a fourth step of assembling the passive current sensor of FIG. 11.

Through an access recess 43', shown in FIG. 12, the connection sections 25' of the two provided voltage drop measuring contacts 23' are accessible. FIG. 13 shows the housing 11' with closed cover element 41'. FIG. 14 shows the housing 11' of FIG. 13 from the underside after the shunt element 63 has been snapped into the housing 11'.

Figure 15:
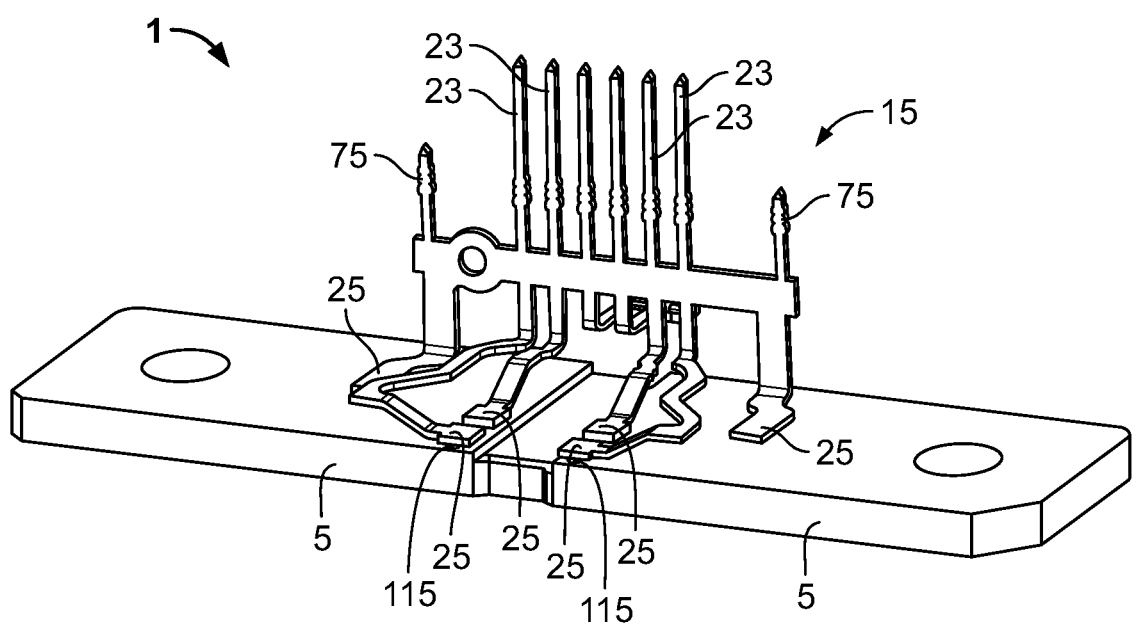
FIG. 15 is a perspective view of a passive current sensor according to an embodiment.
Figure 16:
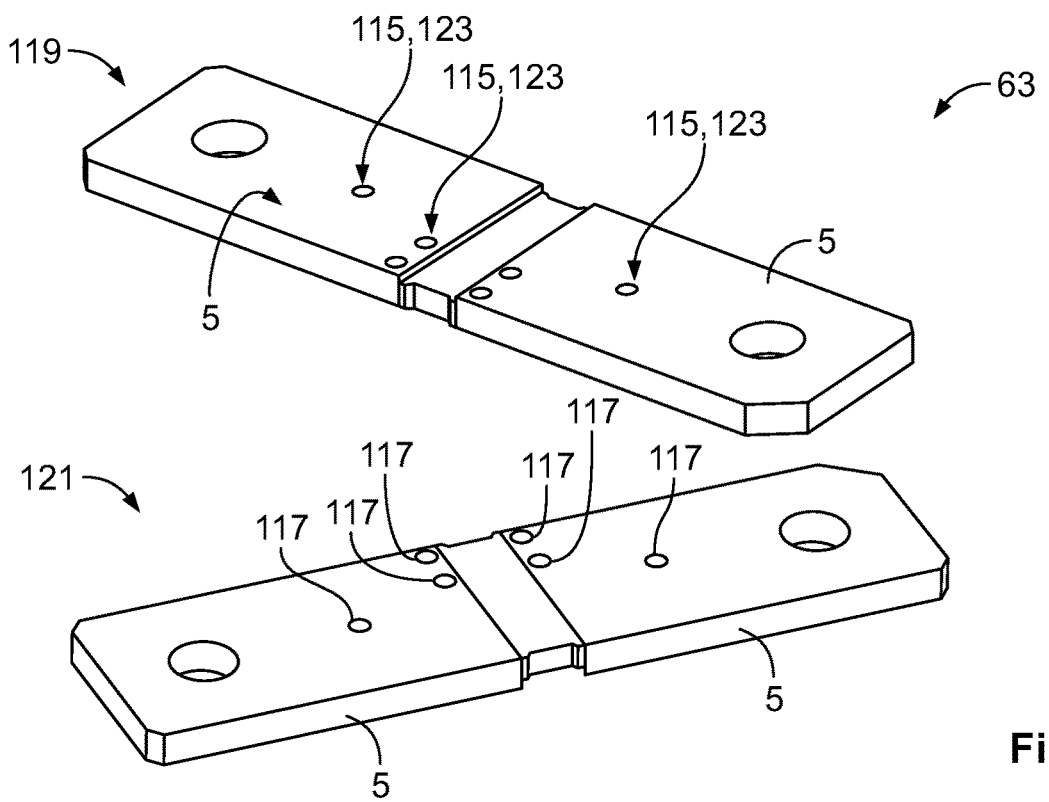
FIG. 16 is a perspective view of a shunt element of the passive current sensor of FIG. 15.

FIGS. 15 and 16 show a further embodiment of the passive current sensor 1 or the shunt element 63. In FIG. 15, the stamping grid 15 is placed on the two busbars 5 in such a way that the connecting sections 25 of the four voltage drop measuring contacts 23 shown and the connecting sections 25 of the fixing pins 75 mechanically touch elevations 115 of the busbars 5. The respective connecting sections 25 are attached to these elevations 115, forming the direct electrical contact to the respective busbar 5.

The elevations 115 can be seen particularly well in a top view 119 of the shunt element 63, shown in FIG. 16. A bottom view 121 of shunt element 63 shows the corresponding recesses 117. The recesses 117 and the elevations 115 are on opposite sides of the busbar 5. The elevations 115 shown represent dome-shaped weld areas 123. In another embodiment, the elevation 115 has a longitudinal extension, so that several voltage drop measuring contacts 23 can be attached to such a formed elevation 115. In particular, the elevation 115 can be an embossed, stamped or pressed elevation 115, which is formed from the material of the busbar 5 without additional material. A recess may be formed on the side of the busbar 5 opposite the elevation 115. In an embodiment, the elevation 115 is monolithically formed from the busbar 5.

The elevation 115, in an embodiment, can be between one twentieth and half the thickness of the busbar 5. If the elevation 115 is circular, its diameter may be approximately equal to the thickness of the busbar 5. For example, a 3 mm thick busbar 5 may be used, without restriction, with an elevation 115 of 2.0 to 2.3 mm in diameter and 0.2 to 0.5 mm in height. The diameter can be 2.1 to 2.2 mm and the height of the elevation 0.3 to 0.4 mm; in another embodiment the elevation can be 0.3 to 0.5 mm high and have a diameter of 1.5 to 2.0 mm. In the case of larger busbars 5, the diameter and height of the elevation 115 can be scaled according to the larger busbar 5.

With the elevations 115, the heat required for example during welding only has to be introduced in a locally limited area of the busbar 5, i.e. in the elevation 115. Because the heat is dissipated to the busbar 5 via the locally limited elevation 115 and not over a large area of the surface of the busbar 5, a more efficient heat input is possible in the area of the elevation 115. In comparison to direct contact with the surface of the busbar 5, a more durable and stronger intermetallic connection between the busbar 5 and the at least one voltage drop measuring contact 23 can therefore be created at the elevation 115.

Figure 17:
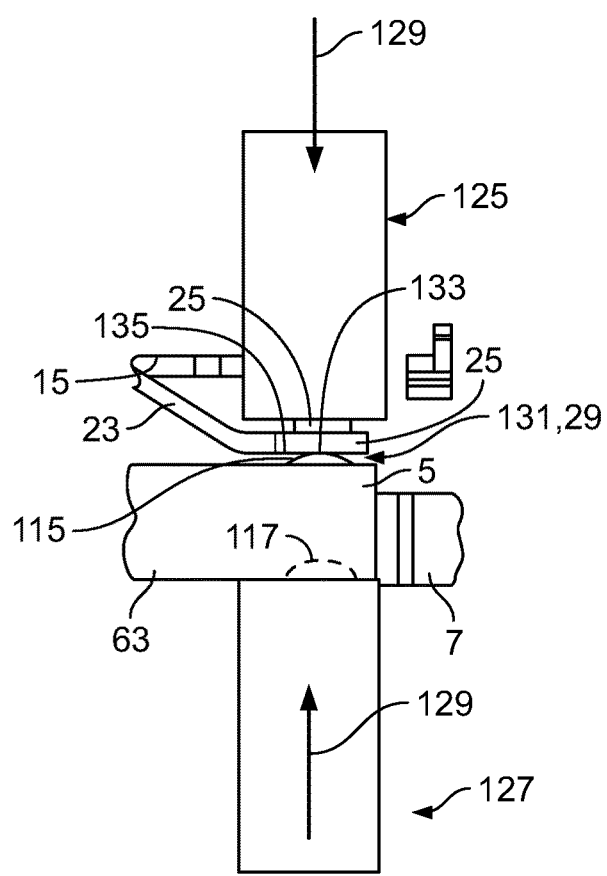
FIG. 17 is a schematic representation of the generation of a direct electrical and mechanical connection of a passive current sensor.

FIG. 17 shows a section of the shunt element 63 and a section of the stamping grid 15 in a side view in a process step, in which a connecting section 25 is directly electrically contacted with the elevation 115 of the busbar 5. Schematically, an upper electrode 125 and a lower electrode 127 are shown, which are pressed along opposite directions of force 129 onto the busbar 5 or onto a connecting section 25. A current (not shown) flows through these electrodes 125, 127, which is introduced in a welding zone 131 via a contact surface 133 from the upper electrode 125 via the connection section 25 into the elevation 115. The contact surface 133 is smaller than an area 135 of the corresponding connection section 25. In the welding zone 131, the direct electrical and mechanical connection 29 is established between the connection section 25 of the voltage drop measuring contact 23 and the busbar 5. In FIG. 17, the recess 117 is also indicated schematically.

For the passive current sensor 1, the method according to the invention, and the assembly 61, no PCB is required. Contact pins 13, which designate both the voltage drop measuring contacts 23 and other measuring contacts, are connected directly to the busbars 5, in contrast to the prior art solutions. Welding is possible due to the direct contact and electrical connection of the contact pins 13 with the busbars 5, whereby welded connections can generally have a higher strength and a lower fault rate. In an embodiment, voltage drop measuring contacts 23 can be welded to the corresponding busbars 5 and at the same time the temperature sensor 35 to the temperature measuring pins 21 in one step.

In addition, saving on PCB and soldering material saves, on the one hand, a component and installation material and, on the other hand, only one single electrical and mechanical connection 29 (that to the busbar 5) is required to connect a contact pin 13, and not two connections, i.e. from the contact pin 13 to the PCB and from the PCB to the busbar 5. The current sensor 1 is therefore simpler than the solutions from the prior art, cheaper, and can increase the service life of the passive current sensor 1 due to the more durable welded connection.

What is claimed is:

1. A passive current sensor, comprising:
   a pair of electrically conductive busbars;
   a shunt resistor electrically connecting the busbars;
   a support having a first pair of voltage drop measuring contacts separate from the busbars, at least one of the voltage drop measuring contacts is attached to each of the busbars and forms a direct electrical contact between the at least one voltage drop measuring contact and the busbar; and
   a pair of temperature measuring contacts, each of the temperature measuring contacts is electrically insulated from the busbars and the shunt resistor.

2. The passive current sensor of claim 1, further comprising a second pair of voltage drop measuring contacts, one of the second pair of voltage drop measuring contacts is directly electrically and mechanically connected to a first busbar of the busbars and another of the second pair of voltage drop measuring contacts is directly electrically and mechanically connected to a second busbar of the busbars.

3. The passive current sensor of claim 1, wherein at least one of the busbars has an elevation for direct electrical contacting of at least one of the voltage drop measuring contacts.

4. The passive current sensor of claim 3, wherein the elevation is monolithically formed from the busbar.

5. The passive current sensor of claim 1, further comprising a temperature sensor electrically connected to the temperature measuring contacts and positioned near the shunt resistor.

6. The passive current sensor of claim 5, wherein an electrical temperature contacting section of the temperature measuring contacts and/or the temperature sensor is accessible via an access recess of the support.

7. The passive current sensor of claim 6, wherein the support has an access protection designed to close at least sections of the access recess.

8. The passive current sensor of claim 1, wherein the voltage drop measuring contacts are each directly electrically and mechanically connected to the busbars at a connecting section.

9. The passive current sensor of claim 8, wherein the connecting section of each of the voltage drop measuring contacts is accessible via an access recess of the support.

10. The passive current sensor of claim 1, wherein the voltage drop measuring contacts each have a bending area connecting a busbar contacting area of the voltage drop measuring contacts with a plug connecting area of the voltage drop measuring contacts.

11. The passive current sensor of claim 1, wherein the voltage drop measuring contacts are each held and/or secured in a pin-receiving opening of the support.

12. The passive current sensor of claim 1, further comprising a dummy pin mechanically fixing a position of the support, the dummy pin connected to at least one of the busbars and at least one of the voltage drop measuring contacts.

13. A method for assembling a passive current sensor, comprising:
   inserting a pair of voltage drop measuring contacts and a pair of temperature measuring contacts into a support;
   positioning and fixing the support to at least one of a pair of electrically conductive busbars electrically and mechanically connected to each other by a shunt resistor; and
   attaching a voltage drop measuring contact directly to each of the busbars, each of the temperature measuring contacts is electrically insulated from the busbars and the shunt resistor.

14. An assembly for a passive current sensor, comprising:
   a support having a plurality of pin-receiving openings;
   a pair of voltage drop measuring contacts directly attached to a busbar;
   a pair of temperature measuring contacts, the voltage drop measuring contacts and the temperature measuring contacts are insertable in the plurality of pin-receiving openings;
   a temperature sensor electrically and mechanically connected to the temperature measuring contacts; and
   a shunt element including a pair of electrically conductive busbars and a shunt resistor electrically connecting the busbars to each other, the temperature measuring contacts are electrically insulated from the busbars and the shunt resistor.

* * * * *